United States Patent
Noguchi

[11] Patent Number: 6,107,679
[45] Date of Patent: Aug. 22, 2000

[54] SEMICONDUCTOR DEVICE

[75] Inventor: Takashi Noguchi, Tokyo, Japan

[73] Assignee: Oki Electric Industry Co., Ltd., Tokyo, Japan

[21] Appl. No.: 09/200,964

[22] Filed: Nov. 30, 1998

[30] Foreign Application Priority Data

Dec. 22, 1997 [JP] Japan ................................. 9-352829

[51] Int. Cl.⁷ .......................... H01L 23/48; H01L 23/52
[52] U.S. Cl. .......................... 257/678; 257/774; 257/772; 257/692; 257/693; 257/700; 257/784; 257/737; 257/773; 257/698; 257/738; 257/680; 361/777; 361/808; 361/820
[58] Field of Search ..................................... 257/678, 690, 257/691, 698, 692, 693, 737, 738, 734, 778, 676, 784, 773, 774, 772, 712, 782, 680, 700, 701; 361/777, 808, 820

[56] References Cited

U.S. PATENT DOCUMENTS

| | | | |
|---|---|---|---|
| 5,285,352 | 2/1994 | Pastore et al. | 257/712 |
| 5,334,857 | 8/1994 | Mennitt et al. | 257/692 |
| 5,399,903 | 3/1995 | Rostoker et al. | 257/734 |
| 5,455,456 | 10/1995 | Newman | 257/738 |
| 5,521,435 | 5/1996 | Mizukoshi | 257/738 |
| 5,581,122 | 12/1996 | Chao et al. | 257/738 |
| 5,592,025 | 1/1997 | Clark et al. | 257/734 |
| 5,612,576 | 3/1997 | Wilson et al. | 257/788 |
| 5,640,042 | 6/1997 | Nakashima | 257/693 |
| 5,657,550 | 8/1997 | Struble | 33/548 |
| 5,736,780 | 4/1998 | Murayama | 257/673 |
| 5,739,588 | 4/1998 | Ishida et al. | 257/782 |
| 5,773,895 | 6/1998 | Hassan et al. | 257/697 |
| 5,777,381 | 7/1998 | Nishida | 257/693 |
| 5,814,883 | 9/1998 | Sawai et al. | 257/712 |
| 5,821,608 | 10/1998 | DiStefano et al. | 257/692 |
| 5,859,475 | 1/1999 | Freyman et al. | 257/738 |
| 5,866,942 | 2/1999 | Suzuki et al. | 257/698 |
| 5,879,568 | 3/1999 | Urasaki et al. | 216/18 |
| 5,893,508 | 4/1999 | Oh | 228/4.5 |
| 5,918,113 | 6/1999 | Higashi et al. | 438/119 |

*Primary Examiner*—Alexander O. Williams
*Attorney, Agent, or Firm*—Rabin & Champagne PC

[57] ABSTRACT

A semiconductor device according to the invention of the present application comprises a base material having a surface on which conductive circuits are formed, a resist film for covering the base material in a state in which peripheral portions of the base material and portions of the conductive circuits are bare, a semiconductor elemental device mounted on the base material and connected to the bare portions of the conductive circuits and electrodes thereof, and a sealing body for sealing the semiconductor elemental device in an area including a range from the resist film for covering the base material to the bare portions. Owing to the provision of the resist in the exposed state of the portions of the base material, the sealing body and the base material are firmly bonded to one another therebetween so that they can be restrained from peeling.

16 Claims, 7 Drawing Sheets

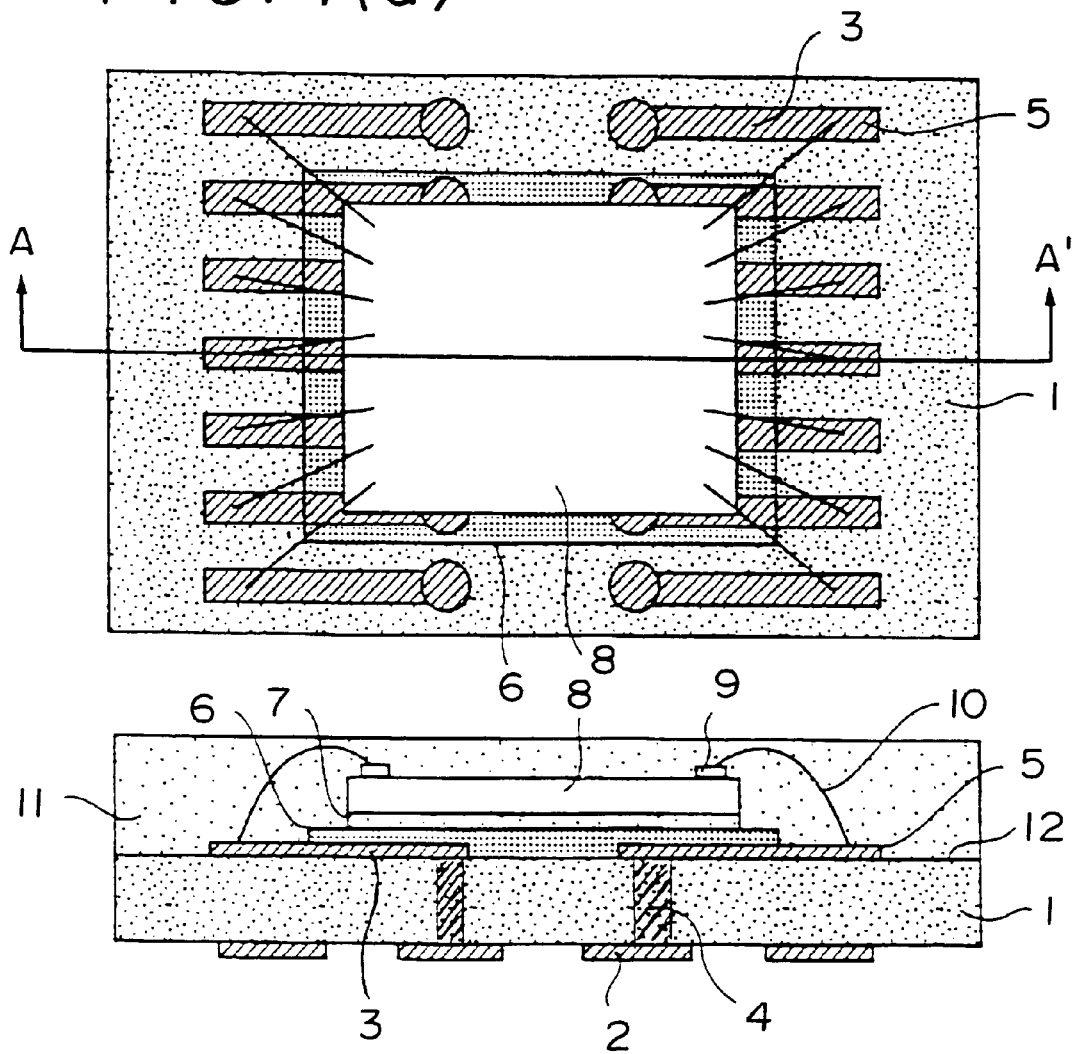
FIG. 1(a)
FIG. 1(b)
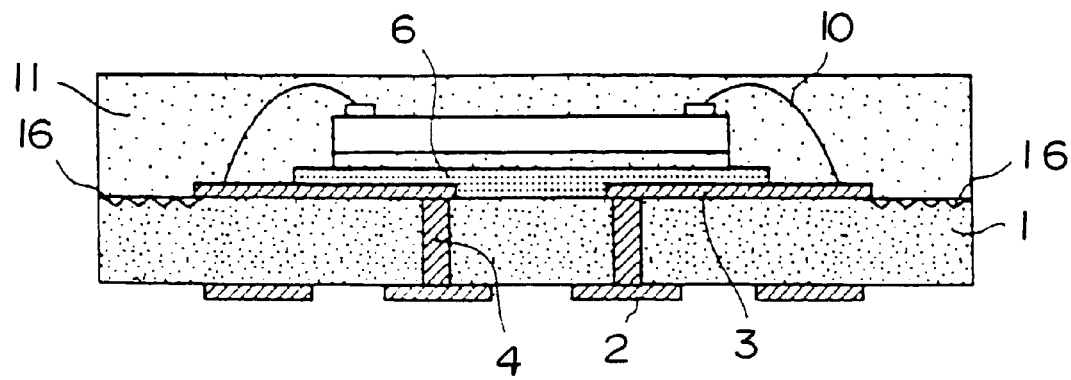
FIG. 2

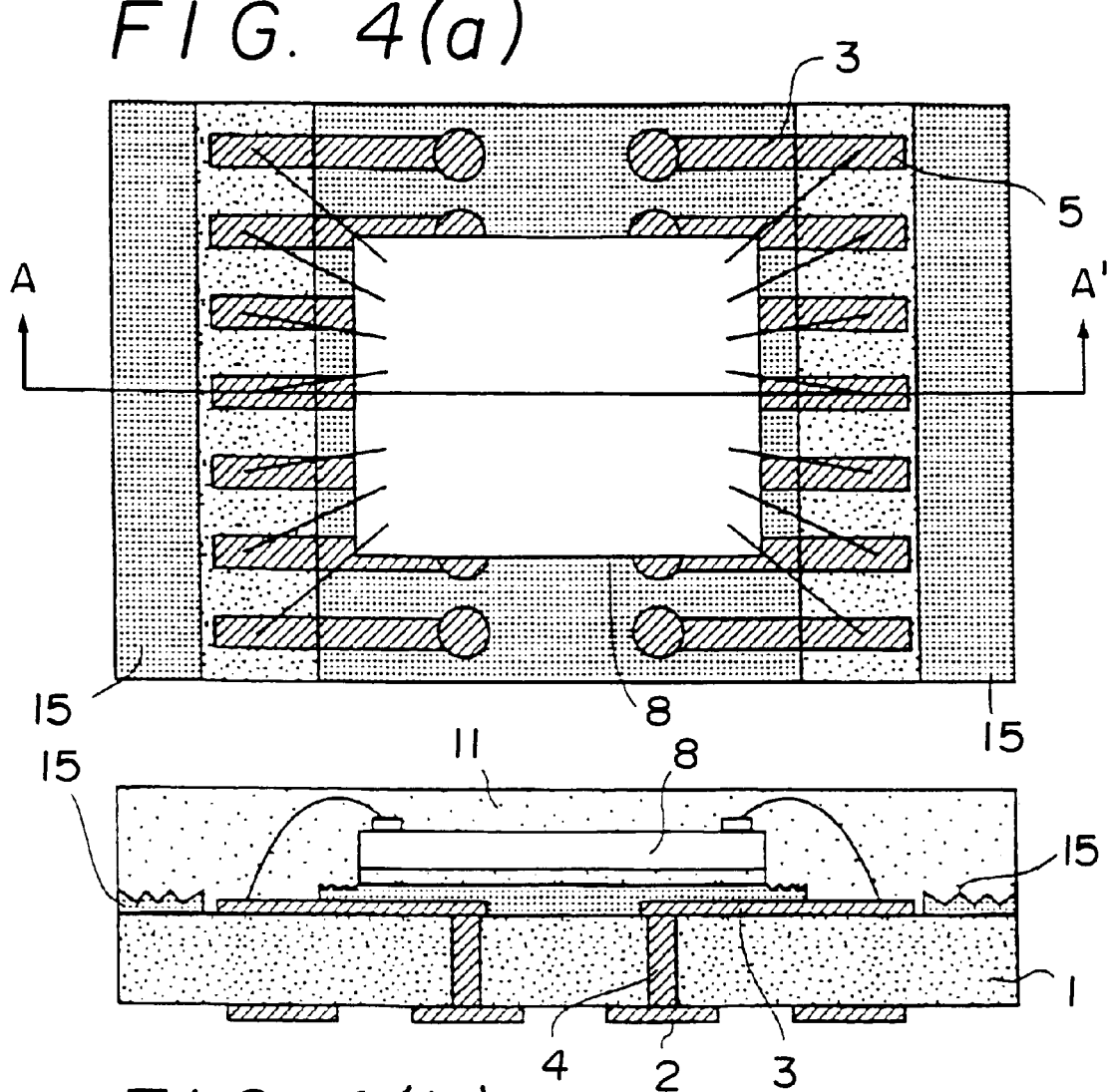

SEMICONDUCTOR DEVICE

BACKGROUND OF THE INVENTION

1. Field of the Invention

This invention relates to a package equipped with a semiconductor elemental device, and particularly to a semiconductor device wherein a semiconductor elemental device mounted on a base material is sealed with a resin.

2. Description of the Related Art

As a conventional technique in such a field, there is known a technique wherein a solder resist is formed over a base material with conductive circuits formed on its surface in a state in which portions of the conductive circuits are exposed, a semiconductor elemental device is fixed onto the solder resist by an adhesive, and the exposed portions of the conductive circuits and electrodes on the semiconductor elemental device are electrically connected to one another and sealed with a resin.

SUMMARY OF THE INVENTION

With the foregoing in view, it is therefore an object of the present invention to restrain a base material and a sealing resin from peeling therebetween.

According to one aspect of this invention, for achieving the above object, there is provided a semiconductor device, comprising:

a base material having a surface on which conductive circuits are formed;

a resist film for covering the base material in a state in which a peripheral portion of the base material and portions of the conductive circuits are bare;

a semiconductor elemental device mounted on the base material and connected to the bare portions of the conductive circuits and electrodes thereof; and a sealing body for sealing the semiconductor elemental device in an area including a range from the resist film for covering the base material to the bare portions.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 1 is a plan view and a cross-sectional view showing a first embodiment of the present invention;

FIG. 2 is a view illustrating a modification of the first embodiment of the present invention;

FIG. 4 is a plan view and a cross-sectional view showing a third embodiment of the present invention;

DETAILED DESCRIPTION OF THE PREFERRED EMBODIMENTS

Figure 3A:
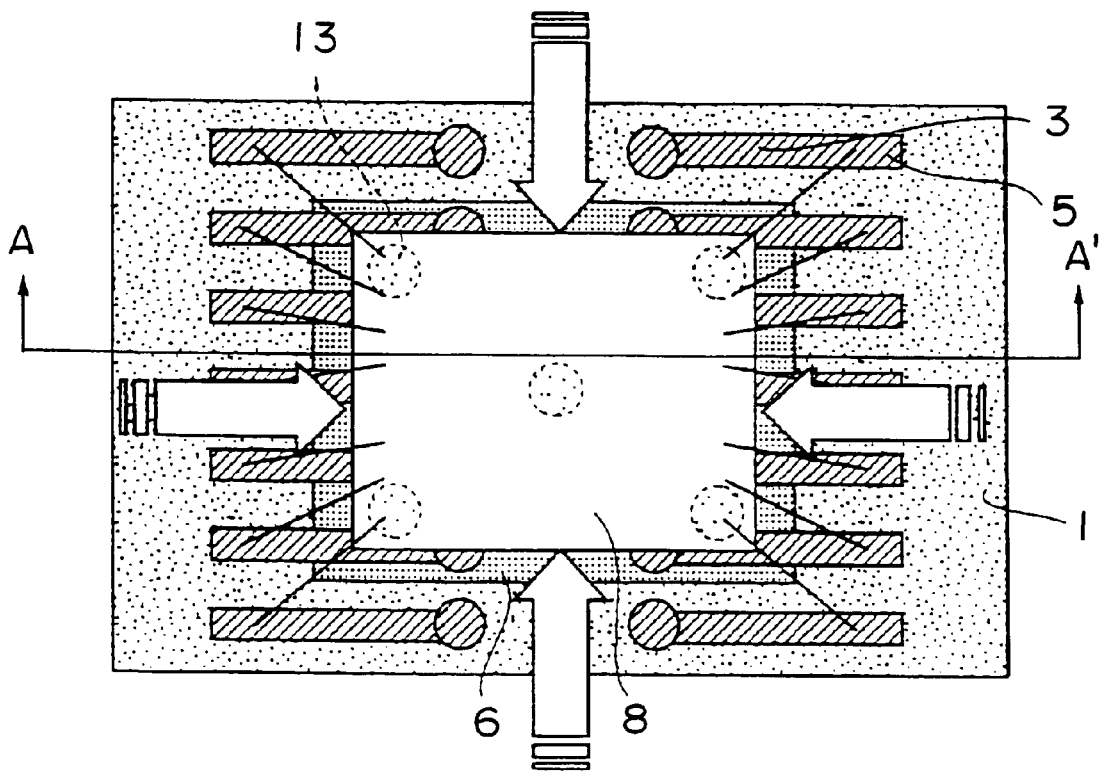
FIG. 3 is a plan view and a cross-sectional view depicting a second embodiment of the present invention.

Preferred embodiments of the present invention will hereinafter be described with reference to the accompanying drawings. FIGS. 1(a) and 1(b) are respectively views for describing a first embodiment of the present invention. FIG. 1(a) is a plan view and FIG. 1(b) is a cross-sectional view taken along line A–A' of FIG. 1(a).

In the first embodiment, a base material 1 composed of a glass epoxy material is first prepared. The base material 1 has external terminals 2 formed on the back thereof, which are electrically connected to the outside, and conductor or conductive patterns 3 formed on the surface thereof. The external terminals 2 and the conductive patterns 3 are respectively electrically connected to one another by vias 4. A solder resist 6 is applied onto the base material 1 as a resist layer composed of an insulating resin. Now, the solder resist 6 is applied onto portions of electrodes 5 electrically connected to a semiconductor element or elemental device, which are for the conductive patterns 3 and portions thereof on which the semiconductor elemental device 8 is mounted in a state in which the periphery of the base material 1 is bare. The solder resist 6 is applied onto substantially the same area as that for the semiconductor elemental device 8 as an area to be applied. The solder resist 6 is applied to the above portions by using, as the applying methods, methods known per se in the art, such as a printing method for applying a resist through, for example, a mask placed on a base material, an exposure system for applying a resist over the entire surface of a base material and thereafter removing unnecessary portions by exposure and development.

The semiconductor elemental device 8 is fixed onto the applied solder resist 6 by an adhesive 7. Silver paste, an epoxy material or the like may preferably be used as the adhesive. Alternatively, an adhesive tape may be used as the adhesive.

Electrodes 9 on the semiconductor elemental device 8 and the electrodes 5 of the conductive patterns are respectively electrically connected to one another by metal thin lines 10 by using the known wire bonding.

Thereafter, the base material 1 including the semiconductor elemental device 8 and the metal thin lines 10 is sealed with a resin 11. This sealing is carried out by the known potting or transfer mold.

Since the sealing resin is in direct contact with the base material 1 at exposed or bare potions 12 of the base material 1 at this time, the resin is high in adhesion strength as compared with the case in which the solder resist 6 is applied to the periphery of the base material 1 and hence the resin is hard to fall off or peel between the sealing resin 11 and the base material 1.

Uneven spots or projections and depressions may be provided at the peripheral portions of the base material 1 as shown in FIG. 2.

In this case, projections and depressions, which are 0.1 mm or more in roughness, are formed around the base material 1 by drilling after the solder resist 6 has been formed on the conductive patterns 3.

Owing to the provision of the projections and depressions around the base material 1 in this way, the area for adhesion between the base material 1 and the sealing resin 11 increases and the base material and the sealing resin can be firmly bonded to each other, so that the resin is hard to further peel.

Figure 3B:
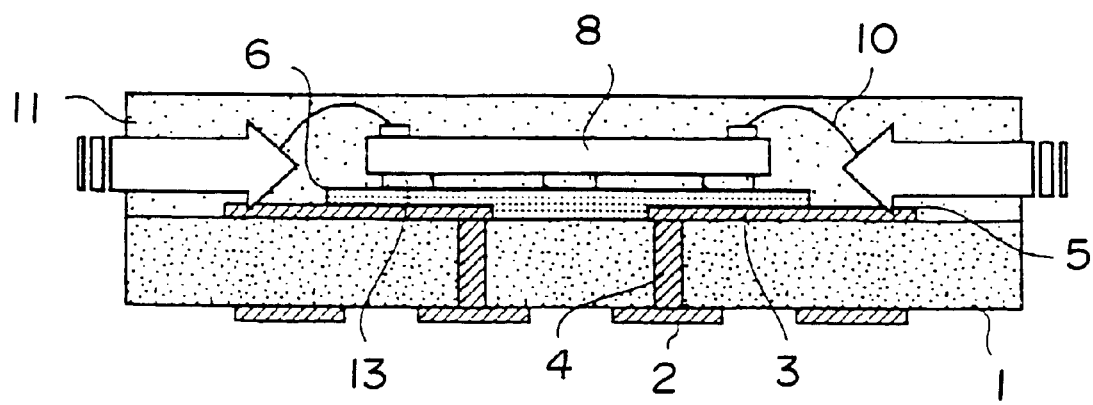

A second embodiment of the invention of the present application will next be explained with reference to FIGS. 3(a) and 3(b). FIG. 3(a) is a plan view of the second embodiment and FIG. 3(b) is a cross-sectional view taken along line A–A' of FIG. 3(a). The same elements of structure are identified by the same reference numerals and their description will be omitted.

In the second embodiment, the adhesive employed in the first embodiment is not formed over the entire back of a semiconductor elemental device 8 but partly formed over the back thereof. Now, the partly formed adhesives 13 are formed to a predetermined height of about 30 µm with a diameter of about 0.5 mm and at intervals ranging from 1.5 mm to 2 mm with respect to each other so that the resin 11 is introduced round even into the back of the semiconductor elemental device 8 lying between the adhesives 13. Further, the adhesives 13 can be partly provided by discharging it through nozzles each having a predetermined size.

Although the present embodiment has described an example in which the adhesives 13 have been used, sheet-like adhesives fixed in sheet form may be used in place of the adhesives. Since the respective sheet-like adhesives become constant in thickness when the sheet-like adhesives are used, the inclination of the semiconductor elemental device 8 can be eliminated, so that a variation in the direction of the thickness of the semiconductor elemental device 8 can be reduced.

A third embodiment of the invention of the present application will next be described with reference to FIGS. 4(a) and 4(b). FIG. 4(a) is a plan view and FIG. 4(b) is a cross-sectional view taken along line A–A' of FIG. 4(a).

The same elements of structure are identified by the same reference numerals and their description will be omitted.

In the third embodiment, a base material 1 similar to that employed in the first embodiment is prepared.

Further, a solder resist is applied onto the base material 1 as a resist layer composed of an insulating resin. Now, the solder resist 15 is applied to the surface of the base material 1 by a method similar to the first embodiment in a state in which portions of electrodes 5 electrically connected to a semiconductor element or elemental device, of conductive patterns 3 have been exposed.

Next, the surface of each solder resist 15 is etched or drilled to thereby define uneven spots or projections and depressions in the surface thereof. At this time, the roughness of the projections and depressions may preferably be 0.1 mm or more.

Thereafter, the semiconductor elemental device 8 is fixed onto the corresponding solder resist 15 in a manner similar to the first embodiment. Electrodes on the semiconductor elemental device 8 and the electrodes 5 of the conductive patterns 3 are respectively electrically connected to one another by metal thin lines 10 using the known wire bonding. Further, the base material 1 including the semiconductor elemental device 8 and the metal thin lines 10 are sealed with a resin.

Since the sealing resin is formed in areas including the projections and depressions formed in the surface of each solder resist at this time, the area for adhesion between the sealing resin and a sealing body 11 increases and hence the resin is hard to peel.

Further, the sealing resin contains particles called "fillers" and the diameter of each particle generally ranges from 0.5 mm to 0.75 mm. therefore, when the roughness of the projections and depressions is set to 0.1 mm or more greater than the particle diameter, the fillers enter into the projections and depressions formed in the solder resist and hence bond strength is further improved.

Figure 5A:
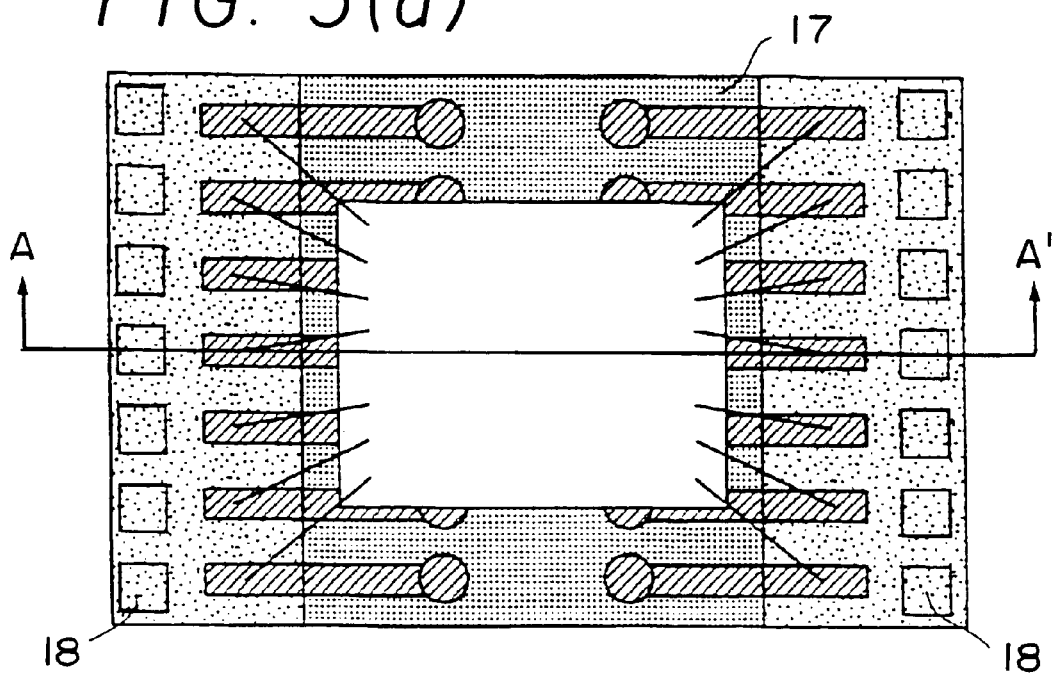
FIG. 5 is a plan view and a cross-sectional view illustrating a fourth embodiment of the present invention.
Figure 5B:
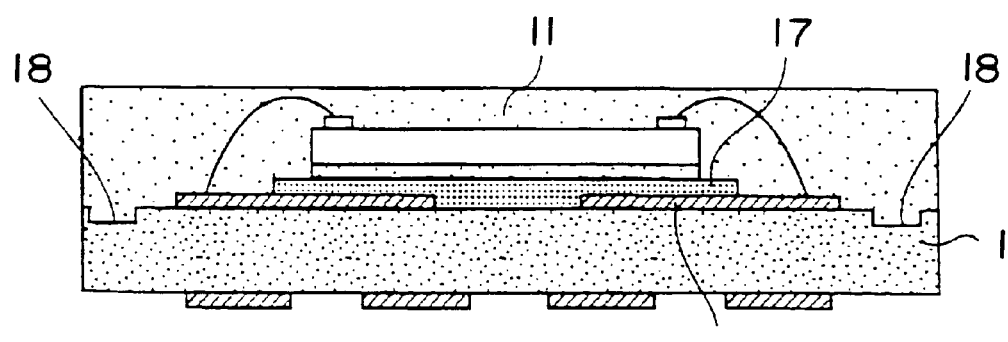

A fourth embodiment of the invention of the present application will next be explained with reference to FIGS. 5(a) and 5(b). FIG. 5(a) is a plan view and FIG. 5(b) is a cross-sectional view taken along line A–A' of FIG. 5(a). The same elements of structure are identified by the same reference numerals and their description will be omitted.

In the fourth embodiment, ends of a base material 1 are rendered bare to form a solder resist 17.

A plurality of counter sinks 18 deeper than the particle diameter of each filler contained in a sealing body, i.e., each of which has a depth of 0.1 mm or more, are provided at the ends of the base material 1 along the sides thereof.

Since the counter sinks 18 are provided in the fourth embodiment, the area for adhesion between the sealing body 11 and the base material 1 becomes wide so that peeling is hard to occur.

Figure 6A:
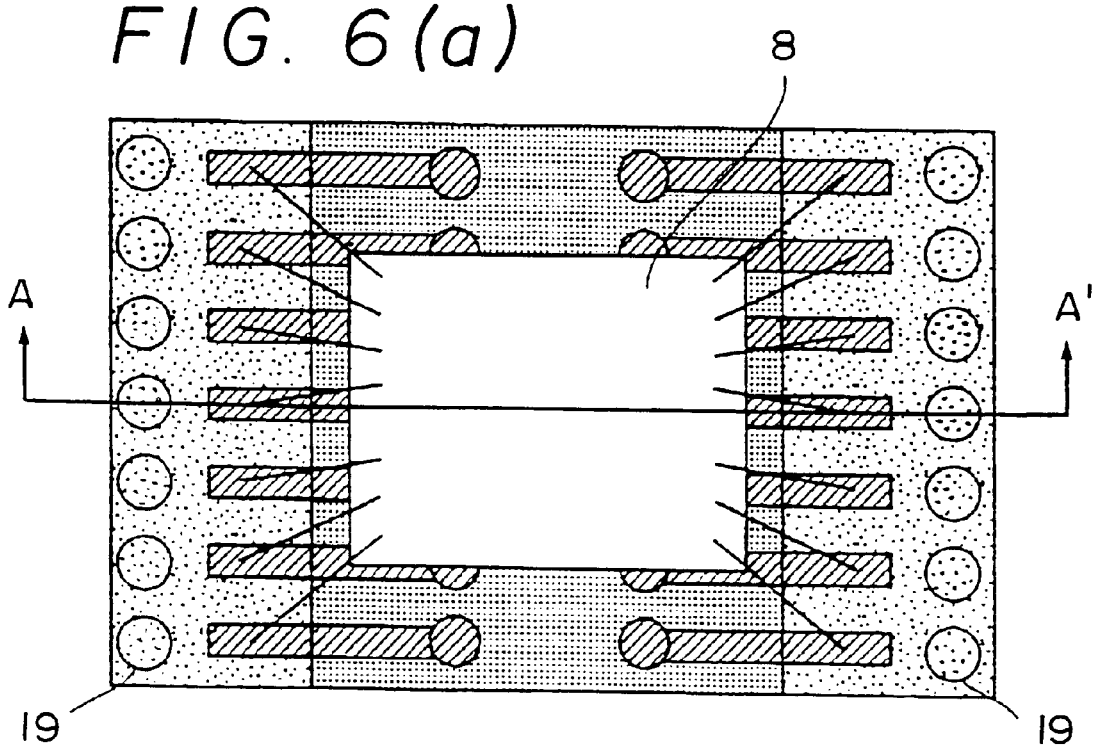
FIG. 6 is a plan view and a cross-sectional view depicting a modification of the fourth embodiment of the present invention.
Figure 6B:
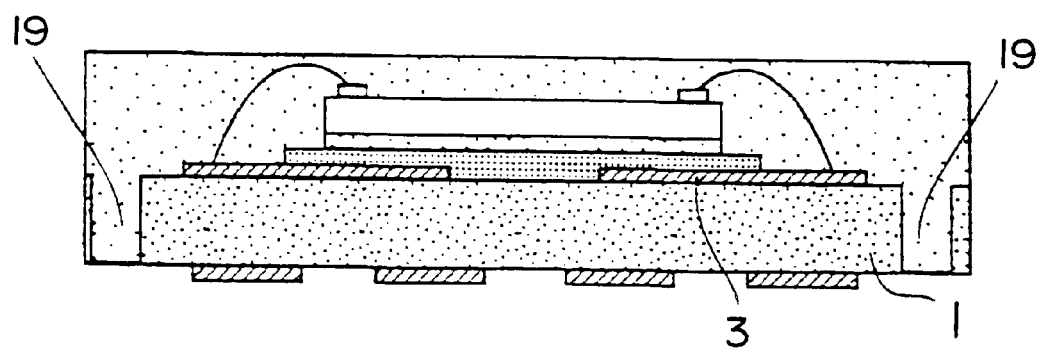

The counter sinks may be circular as shown in FIGS. 6(a) and 6(b). Alternatively, the counter sinks may be via holes 19 each having such a configuration as to extend through the back of the base material 1. When the shape of each counter sink is set circular, the diameter thereof may preferably be about 0.3 mm.

Figures 7A, 7B, 7C:
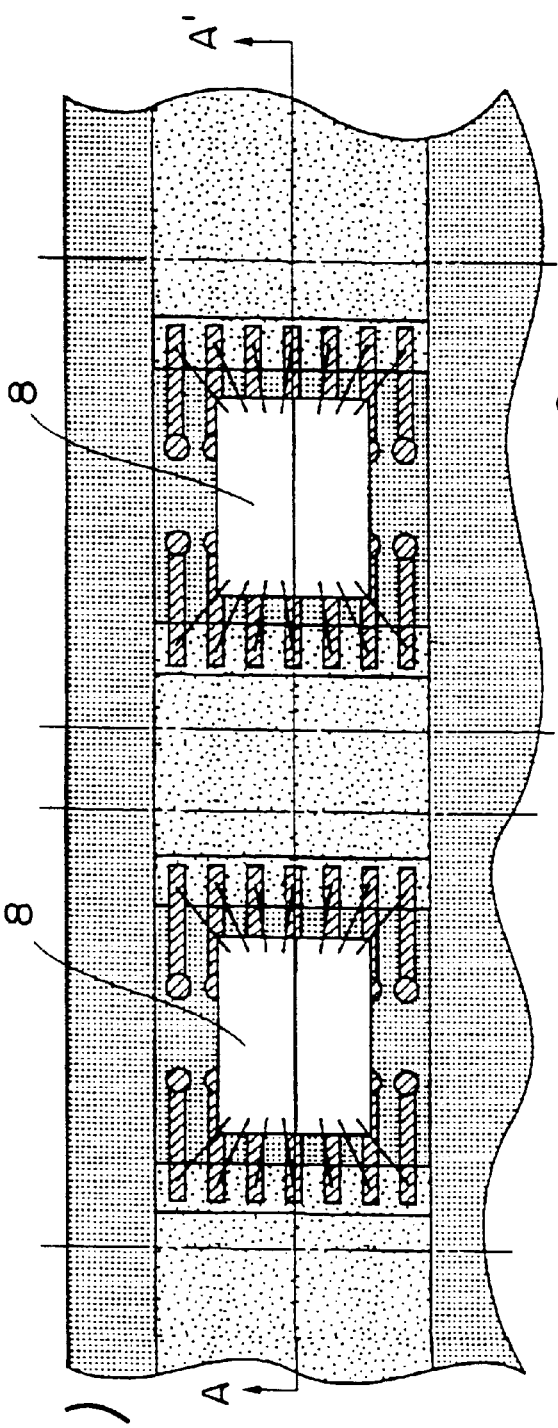
FIG. 7 is a plan view and a cross-sectional view showing a fifth embodiment of the present invention.

A fifth embodiment of the invention of the present application will next be explained with reference to FIGS. 7(a) through 7(c). FIG. 7(a) is a plan view, FIG. 7(b) is a cross-sectional view taken along line A–A' of FIG. 7(a), and FIG. 7(c) is a view showing one of semiconductor devices divided into pieces. The same elements of structure are identified by the same reference numerals and their description will be omitted.

In the fifth embodiment, IC chips 8. are mounted on a base material 1 at predetermined intervals. At this time, conductive patterns 3 and a solder resist 6 are formed below each semiconductor elemental device B. Next, counter sinks 20 each having a depth of 0.1 mm or more are formed between the semiconductor elemental devices 8 of the base material 1. After the formation of the counter sinks 20, the entire surface of the base material 1 containing the semiconductor elemental devices 8 is sealed with a sealing body 11 composed of a resin. Thereafter, portions at which the counter sinks 20 are formed, are cut to obtain each individual semiconductor devices.

Owing to the cutting of the base material 1 at the portions of the counter sinks 20 in this way, areas necessary for peripheral portions of each semiconductor device, which are most apt to peel, can be increased so that the peeling or separation of the sealing body 11 from the base material 1 is hard to occur.

Figure 8A:
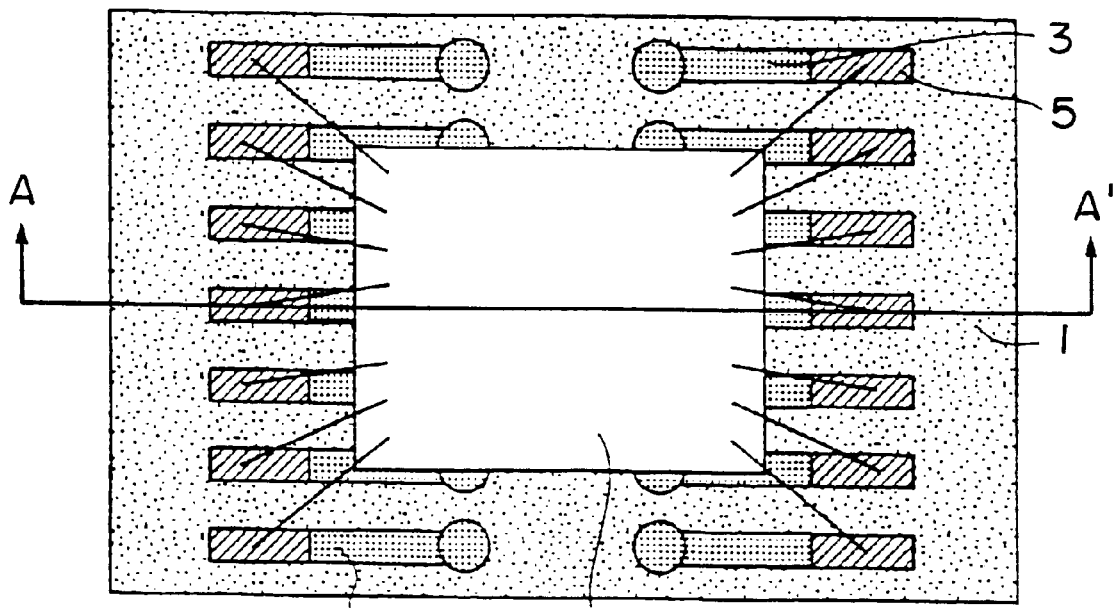
FIG. 8 is a plan view and a cross-sectional view illustrating a sixth embodiment of the present invention.
Figure 8B:
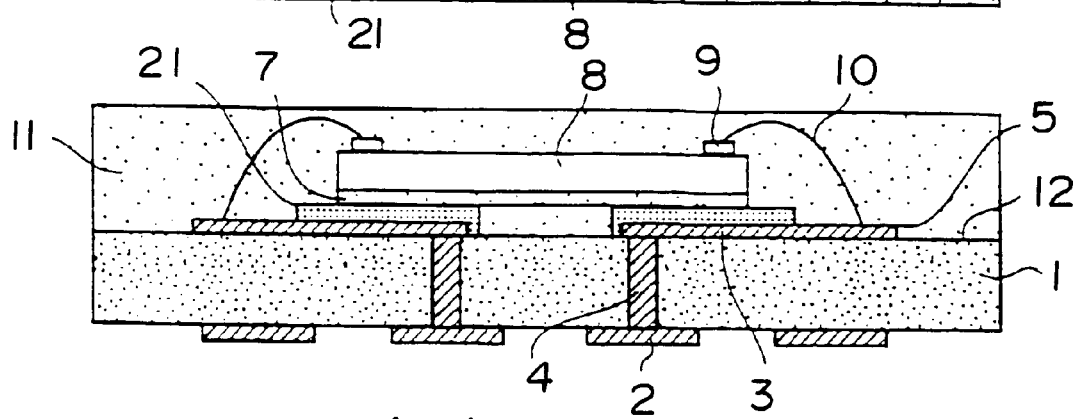

A sixth embodiment of the invention of the present application will next be described with reference to FIGS. 8(a) and 8(b). FIG. 8(a) is a plan view and FIG. 8(b) is a cross-sectional view taken along line A–A' of FIG. 8(a).

The same elements of structure are identified by like reference numerals and their description will be omitted.

The sixth embodiment is constructed in such a manner that solder resists 21 are formed only over their corresponding conductive patterns 3 formed on a base material 1.

Therefore, since portions provided between the respective conductive patterns of the base material 1 are also bare from the solder resists, the strength of bonding between a sealing resin 11 and the base material 1 is further improved.

Further, since the conductive patterns 3 are respectively covered with the solder resists 21 except for portions 5 electrically connected to a semiconductor elemental device, a malfunction such as a short between the patterns due to foreign substances or the like is not produced either.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:

a base material having a surface on which conductive patterns are formed;

a solder resist film covering said base material in a state in which peripheral portion of said base material and portions of said conductive patterns are bare;

an adhesive material adhesively attached to said base material in a mounting location;

a semiconductor elemental device adhesively attached to said adhesive material in said mounting location and electrically connected to bare portions of said conductive patterns and electrodes thereof; and a sealing body sealing said semiconductor elemental device in an area including a range from said solder resist film and covering said base material to said bare portions.

2. The semiconductor device according to claim 1, wherein said base material further has via holes extending from a front to a back thereof and external electrodes formed on the back of said base material, and said conductive patterns and said external electrodes are respectively connected to one another through conductive lines in said via holes.

3. The semiconductor device according to claim 1, wherein said solder resist film is substantially identical in shape to said semiconductor elemental device.

4. The semiconductor device according to claim 1, wherein said adhesive material is partly provided at plural points between said semiconductor elemental device and said solder resist film, and said sealing body is charged between the plural points.

5. The semiconductor device according to claim 4, wherein said adhesive material is a sheet-like adhesive.

6. The semiconductor device according to claim 1, wherein projections and depressions are provided at the peripheral portions of said base material, which are exposed from said solder resist film, and said sealing body is formed in areas including the projection and depressions.

7. The semiconductor device according to claim 1, wherein a plurality of concave portions are provided at the peripheral portions of said base material, which are exposed from said solder resist film, and said sealing body is formed in areas including said plurality of concave portions.

8. semiconductor device, comprising:

a base material having a surface on which conductive patterns are formed;

a solder resist film covering a portion of said surface of said base material and portions of said conductive patterns are bare, said solder resist film having projection and depressions at peripheral portion of said base material;

an adhesive material adhesively attached to said base material in a mounting location;

a semiconductor elemental device adhesively attached to said adhesive material in said mounting location and electrically connected to the exposed portions of said conductive patterns and electrodes thereof; and a sealing body sealing said semiconductor elemental device in areas including the projection and depressions of said solder resist film.

9. A semiconductor device, comprising:

a base material having a surface on which conductive patterns are formed and having openings defined in ends thereof;

a solder resist film covering a portion of said surface of said base material and portions of said conductive patterns;

an adhesive material adhesively attached to said base material in a mounting location;

a semiconductor elemental device adhesively attached to said adhesive material in said mounting location and electrically connected to the exposed portion of said conductive patterns and electrodes thereof; and a sealing body sealing said semiconductor elemental device in areas including the openings defined in said base material.

10. The semiconductor device according to claim 9, wherein said base material is shaped substantially in the form of a rectangle and said openings are provided in plural form along the sides of said base material.

11. The semiconductor device according to claim 9, wherein said base material is shaped substantially in the form of a rectangle and said openings are continuously provided along the sides of said base material.

12. The semiconductor device according to claim 8, wherein the interval between the projections of said projections and depressions is greater than the diameter of each particle contained in said sealing body.

13. The semiconductor device according to claim 6, wherein the size of said each projection is greater than the diameter of said each particle contained in said sealing body.

14. The semiconductor device according to claim 9, wherein the size of said each opening is greater than the diameter of said each particle contained in said sealing body.

15. The semiconductor device according to claim 1, wherein said conductive patterns are electrically connected to external electrodes formed on the back of said base material electrically connected to lines passing through via holes extending through the front and back of said base material, and said semiconductor elemental device is placed on the via holes.

16. The semiconductor device according to claim 6, wherein the interval between the projections of said projections and depressions is greater than the diameter of each particle contained in said sealing body.

* * * * *